United States Patent [19]
Bude et al.

[11] Patent Number: 5,659,504
[45] Date of Patent: Aug. 19, 1997

[54] METHOD AND APPARATUS FOR HOT CARRIER INJECTION

[75] Inventors: Jeffrey Devin Bude, New Providence; Kevin John O'Connor, Lebanon; Mark Richard Pinto, Morristown, all of N.J.

[73] Assignee: Lucent Technologies Inc., Murray Hill, N.J.

[21] Appl. No.: 450,179

[22] Filed: May 25, 1995

[51] Int. Cl.$^6$ .................................................. G11C 11/34
[52] U.S. Cl. ........................... 365/185.27; 365/185.11; 365/185.18
[58] Field of Search .................... 365/185.27, 185.11, 365/185.12, 185.13, 185.18

[56] References Cited

U.S. PATENT DOCUMENTS

| | | | |
|---|---|---|---|
| 5,278,439 | 1/1994 | Ma | 257/319 |
| 5,349,220 | 9/1994 | Hong | 257/322 |
| 5,357,476 | 10/1994 | Kuo | 365/218 |
| 5,412,603 | 5/1995 | Schreck et al. | 365/189.01 X |
| 5,491,657 | 2/1996 | Haddad et al. | 365/185.27 |
| 5,511,021 | 4/1996 | Bergemont et al. | 365/185.27 X |

OTHER PUBLICATIONS

Oshima Y. et al., "Process and Device Technologies for 16Mbit EPROMs with Large-Tilt-Angle Implanted P-Pocket Cell," IEDM Tech. Dig. pp. 95–98 (1990).

Atsumi, S. et al., "Fast Programmable 256K Read Only Memory with On-Clip Test Circuits," IEEE J. Solid-State Circuits, vol. SC-20, No. 1, pp. 422-427 (Feb. 1985).
Bill, C.S. et al., "A Temperature-and Process-Tolerant 64K EEPROM," IEEE J. Solid-State Circuits, vol. SC-20, No. 5, pp. 979-985 (Oct. 1985).
Tsuji, N. et al., "New Erase Scheme for DINOR Flash Memory," IEEE, IEDM 94-53, pp. 3.4.1-3.4.4.
Kazerounlan, R. et al., "A 5 Volt High Density Poly-Poly Erase Flash EPROM Cell," IEDM Tech. Dig., pp. 36-439 (1988).
Onada, H. et al., "A Novel Cell Structure Suitable for a 3 Volt Operation, Sector Erase Flash Memory," IEDM 92-599, pp. 24.3.1-24.3.4.

Primary Examiner—David C. Nelms
Assistant Examiner—Huan Hoang
Attorney, Agent, or Firm—Richard J. Botos

[57] ABSTRACT

The invention is directed to a memory cell with a floating gate and a method for charging the floating gate using channel-initiated secondary electron injection (CISEI). In the device of the present invention, a positive bias voltage of about 1.1 volts to about 3.3 volts is applied between the drain and the source when introducing charge onto the floating gate. A negative bias voltage of about −0.5 volts or more negative is applied to the substrate and the source. The drain substrate bias induces a sufficient amount of secondary hot electrons to be formed with a sufficient amount of energy to overcome the energy barrier between the substrate and the floating gate to charge the floating gate.

22 Claims, 3 Drawing Sheets

METHOD AND APPARATUS FOR HOT CARRIER INJECTION

TECHNICAL FIELD

The invention is directed to electrically programmable read-only memory (EPROMs and EEPROMs) devices.

BACKGROUND OF THE INVENTION

A nonvolatile memory is a type of memory that retains stored data when power is removed. There are various types of nonvolatile memories, including read only memories (ROMs), programmable read only memories (PROMs), erasable programmable read only memories (EPROMs), and electrically erasable programmable read only memories EEPROMs). An EEPROM is erased using ultraviolet light and an EEPROM is erased using an electrical signal. An electrical signal is used to write EPROMS and EEPROMS. In a conventional flash EEPROM ("flash" indicating all memory cells or sectors of cells can be erased at once), memory cells are simultaneously erased to a low threshold voltage and then programmed, either individually or in small groups, to a high threshold voltage. EPROMs and EEPROMs are commonly used in data processing systems that require a nonvolatile memory that is reprogrammable. For convenience, EEPROMs and EPROMs are referred to collectively herein as EPROMS.

A typical device structure for EPROMS is the floating-gate polysilicon transistor. A typical floating gate structure is illustrated in FIG. 1. As depicted in FIG. 1, a floating gate 10, sandwiched between two insulator layers 20 and 60, is between the substrate 30 and the ordinary select-gate electrode 40. The structure depicted in FIG. 1 is a stacked gate memory cell, the word stacked indicating that the floating gate 10 is stacked over the source 50 and drain 70 portions of the substrate. Another EPROM structure is a split gate structure wherein the portion of the floating gate only overlies the drain and no portion of the floating gate overlies the source. Split gate EPROM device structures are described in U.S. Pat. No. 5,349,220, to Hong which is hereby incorporated by reference. As a result, in EPROMS, the select-gate voltage must be capacitively coupled in series with the floating gate rather than directly to the underlying channel.

There are n-channel and p-channel devices with the above structures. In the n-channel devices, the source and drain are doped with an n-type dopant and the substrate is doped with a p-type dopant. In p-channel devices, the source and drain contain p-type dopant and the substrate contains n-type dopant. In silicon based substrates, such as silicon or silicon-germanium (SiGe) alloys, an example of a p-type dopant is boron and example of suitable n-type dopants are arsenic and phosphorous.

EPROMS are programmed by applying a set of bias voltages to the device depicted in FIG. 1. The voltage applied to the select-gate (hereinafter referred to as a control gate) is $V_C$, the voltage applied to the drain is $V_D$, and the voltage applied to the source is $V_S$. Voltage differences, typically referred to as biases, between these various terminals are designated in the following manner: e.g., $V_{CS} = V_C - V_S$ etc. In n-channel devices writing biases are used to introduce additional negative charge onto the floating gate, thereby writing the cell. However, if the charged state is chosen as the "unwritten" state, introducing additional negative charge onto the floating gate will erase the cell. Bias conditions that are used to introduce a more negatively charged state are different from bias conditions that are used to read the charged state or to create a more positively charged state.

These write biases are typically a high control gate-to-source voltage ($V_{CS}$) and/or a high drain-to-source voltage ($V_{DS}$). These programming voltages are sufficient to cause a transfer of electrons from the bulk of the device (channel 80 and/or source 50 and/or drain 70) region to the floating gate 10 where they are trapped, thereby charging the floating gate more negatively. Charge is trapped in the floating gate 10 because the floating gate is isolated from the select-gate 40 by an insulating oxide layer 60 and from the drain-source-substrate region by another thin oxide insulating layer 20. The effect of trapping electrons on the floating gate is to raise the threshold voltage ($V_T$) to some predetermined level. Furthermore, these programming voltages are outside of the range of normal reading bias conditions so that an inadvertent write does not occur during reading.

EPROMS typically include an array of floating-gate transistors. The $V_T$ of a given cell can be determined by a sense amplifier when read and decoded into its logic value. For example, in a conventional two-state memory, a high $V_T$ which has been achieved by writing as described above is decoded as a logic one, and the intrinsic $V_T$ (the $V_T$ of a device which has not been written by adding negative charge to the floating gate 10) is decoded as a logic zero. Because the floating gate is isolated, the cell can remain programmed or erased for periods of up to 10 years and even longer.

One method that is employed to introduce negative charge into the floating gate is channel hot electron injection (CHEI). The objective of CHEI is to heat electrons in the channel to high enough energies so that they enter the conduction band of the oxide layer 20, pass through it, and enter the floating gate 10. In CHEI the electron current which charges the floating gate $I_F$) is initiated by the electron current flowing from the source to the drain ($I_{DS}$). If $I_{DS}$ goes to zero, then $I_F$ goes to zero and, as a result, more negative charge is not introduced into the floating gate.

In order to generate a large enough charge by CHEI to charge the floating gate in a reasonable amount of time, the electrons must be heated in the device to overcome the conduction band energy barrier between the semiconductor and the oxide. In the case of the silicon/SiO$_2$ interface, this barrier is about 3.2 eV. These "hot-electrons" are termed "hot" because their distribution in terms of energy contains a greater proportion of high energy carriers than are present in thermal equilibrium in the crystal lattice of the silicon substrate. The "hot electrons" gain their energy from electric fields and potential energy drops in the device.

In CHEI some fraction of the electrons which travel from the source 50 to the drain 70 (these electrons are part of the drain-source current, designated as $I_{DS}$) gain enough energy from the source-drain potential drop to have 3.2 eV at the oxide interface. Some fraction of the channel hot electrons that have this energy enter the conduction band of the oxide layer 20 and are conveyed to the floating gate 10.

An electron, moving from the source to the drain, gains an amount of energy that is essentially limited to the high field potential drop in the channel. The high field potential drop in the channel is typically less than the sum of the source-drain bias ($V_{DS}$) and the built-in potential between the channel and the drain. Typically the built-in potential of the channel to the drain does not exceed 0.3 V. The sum of these values is referred to as $E_{max}$.

In the absence of effects such as electron-electron scattering, conservation of energy dictates that the electrons which fall through the potential drop $E_{max}$ can gain an amount of energy that is, at most, equal to the potential energy drop which is the product of $E_{max}$ and the electronic charge (q; where q is the charge of the electrons in coulombs). (By way of background, an electric potential is expressed in units of V. If an electron falls through a potential drop of V, it gains energy (q×V) which is expressed in units of eV.) The effects of electron-electron scattering are typically insignificant because the energy required for electron injection into the floating gate is 3.2 eV, and very few electrons obtain this energy threshold through such effects.

A $V_{DS}$ of 3.2 V does not currently provide for negatively charging the floating gate (referred to herein as the "write") in a practical amount of time. A practical amount of time is currently about 1 ms or less. In current devices, at least 5 V must be introduced into the device in order for the high field potential energy drop in the channel to be the requisite 3.2 eV or higher. Even higher voltages are required if smaller write times are desired.

SUMMARY OF THE INVENTION

The present invention is directed to electrically programmable memory devices such as EPROMs and EEPROMs and a method for introducing negative charge onto the floating gate in these devices using channel initiated secondary electron injection (CISEI). In CISEI, like CHEI, the current that charges the floating gate $I_F$ is initiated by the electron current from the source to the drain so that $I_F$ goes to zero as $I_{DS}$ goes to zero. However, the mount of CISEI produced by the process of the present invention is sufficient to charge the floating gate in about 1 ms or less when a $V_{DS}$ of less than 5 V is applied to the device. This is because the number of high energy electrons produced by CISEI is not limited to the voltage difference $V_D$-$V_S$. CISEI uses the secondary electrons heated by impact ionization feedback. In a preferred embodiment, $V_{DS}$ is less than about 3.3 V.

In the present invention, an environment is created in which secondary electrons are heated by impact ionization feedback with greater frequency than in prior art devices. This process is initiated by impact ionization in the channel of the device. Electrical fields and potential energy drops (referred to collectively as "fields") which are non-parallel to the flow of electrons in the channel are utilized in the device for this purpose. For convenience, these fields are referred to as vertical fields. Examples of these fields include the field between the substrate and the drain and the field between the substrate and the oxide interface near the drain edge. This is in contrast to prior art devices in which the electrons gain their energy from the electrical fields and the potential drops that are in a direction that is parallel to the flow of electrons in the channel.

In one embodiment of the present invention, the vertical fields and potential energy drops are enhanced in the device by biasing the substrate with a negative voltage ($V_B$). When it is desired to introduce negative charge onto the floating gate (e.g. when it is desired to write the floating gate) it is advantageous if the drain is biased relative to the source ($V_{DS}$) to about 1.1 V to about 3.3 V and the substrate is biased relative to the source ($V_{BS}$) to about –0.5 V to about –3 V. In a preferred embodiment $V_S$=0 V, 1.1 V$\leq V_D \leq$3.3 V, and –3 V$\leq V_B \leq$–0.5 V.

In an present embodiment of the present invention, the vertical electric fields near the drain- channel and drain substrate junctions are increased over prior art EPROMS by modifying the device structure. Many different expedients are contemplated to achieve this objective. For example, the substrate doping is increased in the vicinity of the drain- substrate junction. In another embodiment, the gate oxide thickness is about 10 nm or less and the shallow drain junctions are about 0.1 microns or less from the oxide interface. This enhances the vertical field in the device, which accelerates the feedback heating process in CISEI and enhances the fields parallel to the channel, which increases the incidence of impact ionization of channel electrons, which is the mechanism that initiates CISEI. The shallow junctions also shorten the distance which the secondary electrons have to travel to reach the oxide surface. The shorter the distance that the secondary electrons are required to travel to the oxide barrier, the greater the likelihood that the secondary electrons will retain enough energy to leap the oxide barrier and charge the floating gate.

In another embodiment of the invention, the active region of the device in which the channel, source, and drain are formed is a material with a band gap lower than that of silicon. Lower band-gap materials have lower threshold energies for impact ionization, and consequently, more channel impact ionization and impact ionization feedback occurs in these lower band gap materials than in silicon at a particular $V_{DS}$. Examples of suitable materials include alloys of silicon and germanium. It is advantageous if the band-gap discontinuity between these two materials is only in the valence band and not in the conduction band. Although it is contemplated that the benefits of the invention may be achieved by these alternate embodiments individually, it is advantageous if these modifications to the device structure are used in conjunction with the application of a substrate bias voltage to the device when the device is operated in the write mode. In an alternate embodiment, however, a device with a junction depth of about 0.05 µm or less, a drain with an n-type dopant concentration of at least about $5 \times 10^{19}/cm^3$, a drain halo with a p-type dopant concentration of at least about $2 \times 10^{18}/cm^3$, and an oxide thickness between the floating gate and the substrate of about 10 mm or less will provide a vertical field such that, when a $V_D$ of about 1.1 V to about 3.3 V is applied to the device, the floating gate is negatively charged when $V_{BS}$ is zero in 1 msec or less.

In the process of the present invention, an EPROM or EEPROM is written using CISEI by applying a negative substrate-source bias ($V_{BS}$) to the EEPROM only in the write mode. In one embodiment, $V_{BS}$ is about –0.5 V to about –3 V. In the write mode, the $V_{DS}$ applied to the device is lower than 5 V. It is advantageous if $V_{DS}$ is about 1.1 volts to about 3.3 volts. It is advantageous if $V_{CS}$ is 10 V or less. In a preferred embodiment, the floating gate is negatively charged in about 1 ms or less, when the control gate voltage, $V_{CS}$, is less than or equal to $V_{DS}$.

DETAILED DESCRIPTION

Figure 1:
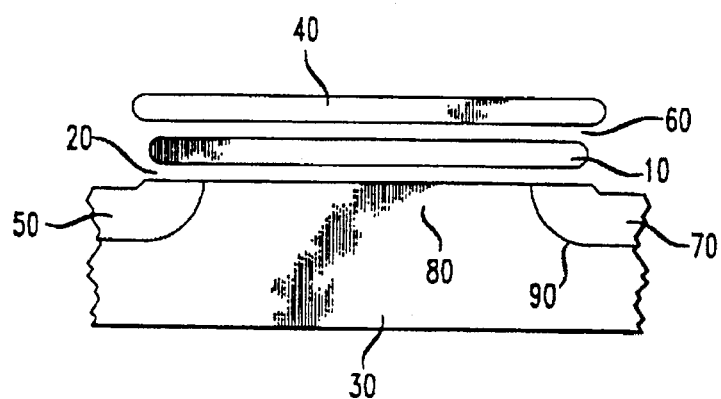
FIG. 1 is a sectional view of a prior art type of flash memory cell.

The present invention contemplates floating gate devices (e.g. EPROMS) that utilize CISEI to introduce negative charge onto the floating gate thereby "writing" the EPROMS. For convenience herein, the introduction of negative charge onto the floating gate is referred to as writing the EPROMS. However, because EPROMS are programmable charge storage elements, they have more general application than simply "charged" and "uncharged". For example, two or more different levels of charge may be stored on, read from, and decoded from a single cell. Analog signals may be stored as a continuum of charge levels, which permits EPROMS to be used for neural network applications and analog data storage. In addition, additional charge might be introduced to correct the charge level of the floating gate. Such a correction might be necessary if the charge level has been set by a Fowler-Nordheim tunneling erase. Therefore, references to a "writing pulse" herein refer to a set of voltages applied for a period of time that is typically less than one second to the drain, source, control gate and substrate of an EPROM for the purpose of adding a negative charge to the floating gate. "Writing" and "writing operation" are used to describe the execution of the writing pulse as defined above. The present invention also contemplates a method for writing EPROMS using CISEI. CISEI is the combination of three successive events. First, channel hot electrons, e1, are injected into the drain where they impact ionize to form low energy electron-hole pairs (e2, h2). The current carried by the channel electrons is represented by $I_{e1}$ (which is approximately equal to the source-drain current, $I_{DS}$). The currents of the electrons, e2, and the holes, h2, that are generated by impact ionization are designated as $I_{e2}$ and $I_{h2}$, respectively. The following relationship between these currents is defined by the equation:

$$I_{h2}=I_{e2}M_1 \times I_{e1}.$$

The holes, h2, are heated By the fields in the drain-substrate region and are injected into the substrate where they impact ionize again to form electron-hole pairs (e3, h3). The e2 electrons leave the drain, but typically (for $V_{DS}$ less than about 5 V) do not have adequate energy to overcome the Si/SiO$_2$ conduction band energy barrier to charge the floating gate. The current of e3 electrons formed by the impact ionization of the h2 holes is represented by $I_{e3}$. The relationship between $I_{e3}$ and the h2 hole current is defined by the following equation:

$$I_{h3}=I_{e3}=M_{2\times}I_{h2}$$

The e3 electrons are either injected into the drain and diffuse to the oxide interface or they fall through the vertical potential drop and reach the oxide interface. In either event, some of the electrons will have a sufficient amount of energy to surmount the oxide barrier and be in a position where they can be injected into the floating gate. This process continues with impact ionization of the e3 electrons, which produces subsequent electron hole pairs (e4, h4; e5, h5; etc.). For ease of reference, e2, e3, e4, etc., are referred to as "secondary electrons." The process described above involving alternating electron and hole impact ionization events that result in the creation of e2, e3, e4, etc. and 132, h3, h4, etc. is referred to as "impact ionization feedback". The creation of hot secondary electrons by this process is referred to as "heating by impact ionization feedback."

As previously noted, the current of these secondary electrons ($I_{e2}$, $I_{e3}$, etc.) is related to the current of the previous generation of secondary holes by a multiplier, e.g. $I_{e3}=M2\times I_{h2}$. When the device is not biased in breakdown (i.e., a condition is which $|M_1|\leq 1$, $|M_2|\leq 1$, etc.) the floating gate is written primarily with e3 electrons. Typically, devices of the present invention are biased in breakdown when the $V_{DS}$ is greater than about 9 V, although this breakdown threshold decreases as the drain-substrate junction doping increases.

The total current of e3 electrons leaving the device is the product of the source drain current ($I_{DS}$), $M_1$, and $M_2$. The gate current, 16, is some fraction, T, of this product. This fraction T includes the probability that a given e3 electron will reach the oxide interface, the probability that, once it reaches the interface, it will surmount the oxide conduction band barrier, and the probability of it reaching the floating gate electrode once it has surmounted the oxide conduction band barrier. Based upon this mathematical relationship, the floating gate current, $I_F$, is the product of $(I_{DS})\times(M_1)\times(M_2)\times T)$.

EPROMS and methods for making these devices are well known to one skilled in the art. The present invention contemplates methods for biasing EPROMS and modifications to conventional n-channel EPROM and EEPROM structures to achieve the desired effect. Methods for making entire EPROM or EEPROM devices are not discussed herein. The expedients used to make the desired modifications to the structure of the conventional EPROMS are described.

Figure 2:
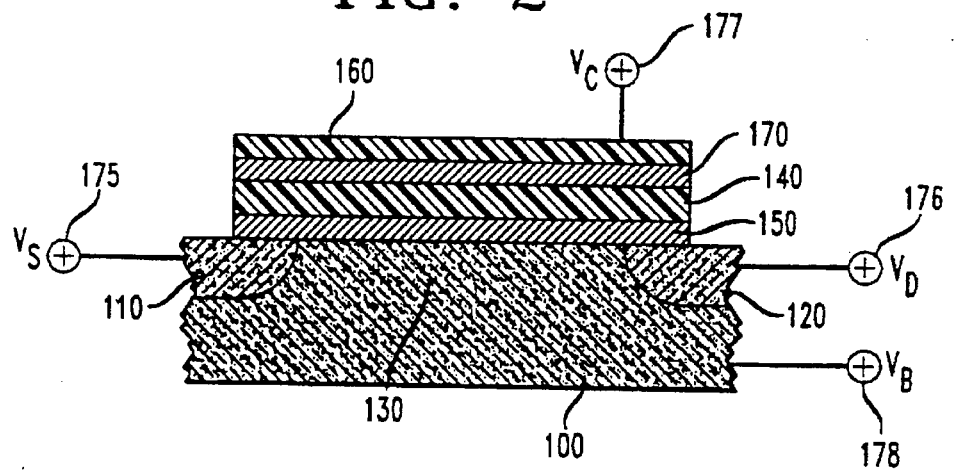
FIG. 2 is a sectional view of a flash memory cell with a bias applied to the substrate.

The devices of the present invention exhibit an increased effect from heating by impact ionization feedback in a number of different ways. For example, an EEPROM of the present invention is depicted in FIG. 2. The EEPROM in FIG. 2 has the stacked gate structure of a double-polysilicon MOSFET (metal-oxide-semiconductor field effect transistor). The EEPROM in FIG. 2 has a substrate 100, source region 110, drain region 120, channel 130, floating gate 140, and control gate 160 found in conventional EEPROMs. The floating gate 140 is a layer of polysilicon isolated from the substrate 100 and the control gate 160 by a first layer of silicon dioxide 150 and a second layer of silicon dioxide 170, respectively. The first layer of silicon dioxide 150 is sufficiently thin, i.e. about 100 Angstroms or less, for electrons to pass therethrough by either Fowler-Nordheim (FN) tunneling or by hot electron injection.

The source region 110 is connected to a voltage source ($V_S$) 175 and the drain region 120 is connected to a voltage source ($V_D$) 176. The control gate 160 is connected to a voltage generator ($V_C$) 177 and the substrate 100 is connected to a voltage source ($V_B$) 178. To inject electrons into the floating gate 140 using the CISEI mechanism, it is advantageous if the device is biased in the following manner: 1.1 V$\leq V_{DS}\leq$3.3 V; and $-3$ V$\leq V_{BS}\leq -0.5$ V. In one embodiment the source voltage is a reference zero volts.

It is apparent to one skilled in the art that the amount of $V_{CS}$ needed to negatively charge the floating gate depends upon the capacitive coupling between the floating gate and the control gate. This in turn depends upon the structure and geometry of the insulator between the floating gate and the control gate and the structure and geometry of the floating gate and the control gate themselves. In the device and process of the present invention, it is advantageous if the voltage applied to the control gate is 10 V or less, when $V_{DS}$ and $V_{BS}$ are as previously described. In one embodiment, $V_{CS}$ is less than or equal to $V_{DS}$. It is advantageous if the device depicted in FIG. 2 is operated under the following exemplary conditions:

| $V_D$ | $V_S$ | $V_C$ | $V_B$ |
|---|---|---|---|
| about 1.1 V to about 3.3 V | 0 V | $\leq V_D$ | about $-0.5$ V to about $-3$ V |

In the above-described embodiment, the minimum VD (about 1.1 V) is approximately the temperature-dependent band gap energy of silicon. Therefore, in order for impact ionization to occur in the channel region 130 or drain region 120 of the device depicted in FIG. 2, electrons in the channel must reach at least this potential. Although applicants do not wish to be held to a particular theory, because of the positive bias that results from the relationship between $V_D$, $V_S$, and $V_B$ described above, the secondary electrons, e2, described above leave the drain via $V_D$) while the secondary holes, h2, return to the substrate 100 by diffusing to and drifting through the drain-substrate depletion region of the device, which is the region at the boundary between the drain 120 and the substrate 100. The holes, h2, are heated to higher energies by the potential difference between the drain and the substrate that results from the positive difference between $V_{DS}$ and $V_{BS}$, which causes the h2 holes to impact ionize further. The electrons that result from this impact ionization either flow back into the drain because of the positive $V_{DS}$-$V_{BS}$ bias, and are further heated by the potential drop between the drain 120 and the substrate 100 or return to the channel region 130 where they are further heated by the vertical potential drop in the channel which is enhanced by $V_{BS}$.

Figure 3:
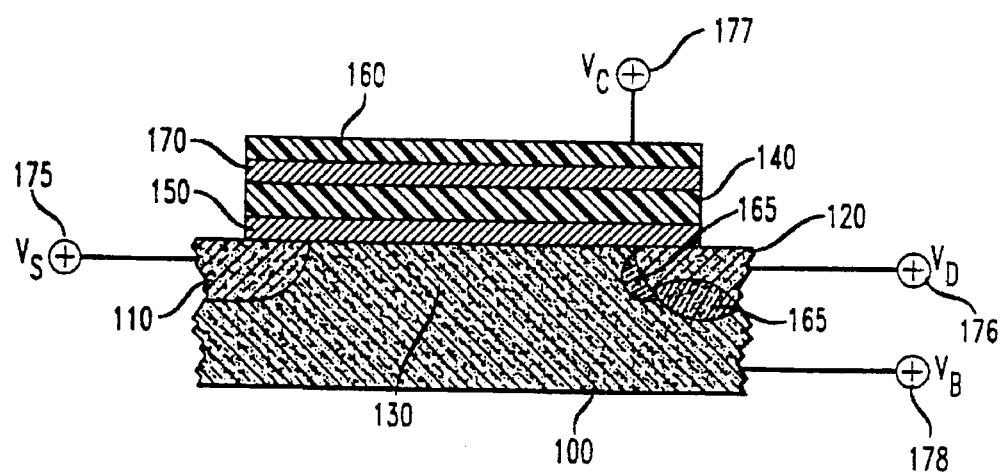
FIG. 3 is a sectional view of a flash memory cell with a heavily p-doped region at the drain-substrate junction.

An alternate embodiment of the present invention is depicted in FIG. 3 In this embodiment, the maximum p-type doping at the drain-substrate junction, region 165, is at least about $5 \times 10^{17/cm3}$. Boron is an example of a suitable p-type dopant. It is advantageous if the p-type doping is relatively large at the drain-substrate junction, but relatively small in the channel region of the substrate near the oxide interface and other regions of the substrate. One exemplary method for increasing the p-type dopant concentration in the channel is to form a "halo" implant or a "p-pocket" implant. An exemplary process for introducing a p-pocket implant into the substrate/drain boundary region of the device is disclosed in Oshima, Y., et al., "Process and Device Technologies for 16 Mbit EPROMs With Large-tilt-angle Implanted P-Pocket Cell, " *IEDM Tech. Dig.*, 90, pp. 95–98 (1990) which is hereby incorporated by reference. P-type dopant densities of at least about $5 \times 10^{17}/cm^3$ at the drain/substrate region increase the electrical field that is established at the boundary between the drain and the substrate when a positive bias voltage is applied between the drain and the substrate. This increased field causes $M_1$, $M_2$, $M_3$, etc. and T to increase, resulting in an increased injection current into the floating gate $I_F$. An EEPROM with this structure will write the floating gate in 1 ms or less under the following conditions: VS=0; $V_B$=$-2.5$; $V_C$=2.5; and $2.5 \leq V_D \leq 3$.

Figure 4:
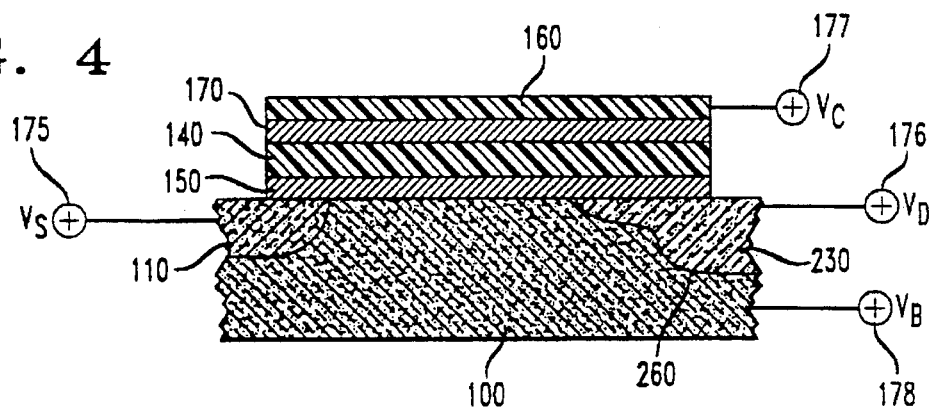
FIG. 4 is a sectional view of a flash memory cell with a shallow drain extension.

Another embodiment of an EEPROM of the present invention is depicted in FIG. 4. In the EEPROM illustrated in FIG. 4, the doping profile of the drain region 230 is modified so that the drain-substrate junction is less than 0.1 μm below the oxide interface. The shallow drain-substrate junction provides a short e3 cooling distance, which increases the probability T of electron injection into the floating gate. The drains in the EEPROMs of this embodiment are doped with standard n-type dopant for like devices, examples of which are arsenic and phosphorous. It is advantageous if the minimum dopant concentration in the drain region is about $5 \times 10^{19}/cm^3$.

Figure 5:
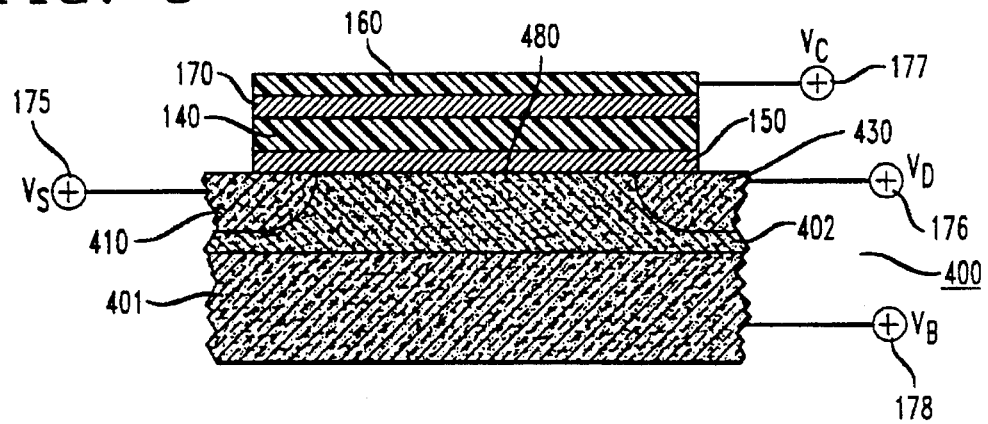
FIG. 5 is a sectional view of a flash memory cell in which the substrate is a two layer structure of p-doped SiGe over p-doped silicon.

Another embodiment of an EEPROM of the present invention is illustrated in FIG. 5. In this embodiment, the substrate region 400 is made of two different materials. The lower region is p-type silicon 401, which is a conventional material for EEPROM substrates. The device active region 402 is made of a silicon alloy with a band gap that is lower than that of bulk silicon. The device is biased as described above. Examples of suitable alloy materials include silicon-germanium (SiGe). The n-type drain 430 and source region 410 are formed in the otherwise p-type SiGe region 402. The SiGe region 402 extends to a depth of at least about 0.02 μm below the drain junction. It is advantageous if the discontinuity of the band-gap between the silicon substrate and the silicon alloy in the device active region is in the valence band. It is also contemplated that the SiGe region 402 is the drain region 430 and a portion of the channel 480, but not the source region 410.

Because the devices of the present invention utilize the drain-substrate bias to affect electron injection into the substrate, the devices can be selectively enabled or disabled by varying the substrate voltage to a device or a particular block of devices. For example, in an array of EEPROM cells 600 depicted in FIG. 6, the array is divided into two blocks 601 and 602. The substrate connections 610 to a particular block are commonly connected to a block select, 611 and 612, respectively for blocks 601 and 602. The block selects 611 and 612 are isolated from each other and consequently, the substrate voltage in one block is capable of being modulated differently from the substrate voltage in other blocks. Blocks 601 and 602 each have 12 EEPROM cells 600 illustrated, but, as indicated by the dashed line, many more cells are capable of being incorporated into the array.

The array of EEPROM cells is arranged in three rows 620, 621, and 622. The cells in each row are selected by word lines 630, 631, and 632, respectively. Each word line is provided with grounded source nodes, 640, 641, and 642, respectively, that provide a return current path. The drains 650 of the cells 600 in each column of cells 645 are connected to a bit/data line 650.

Figure 6:
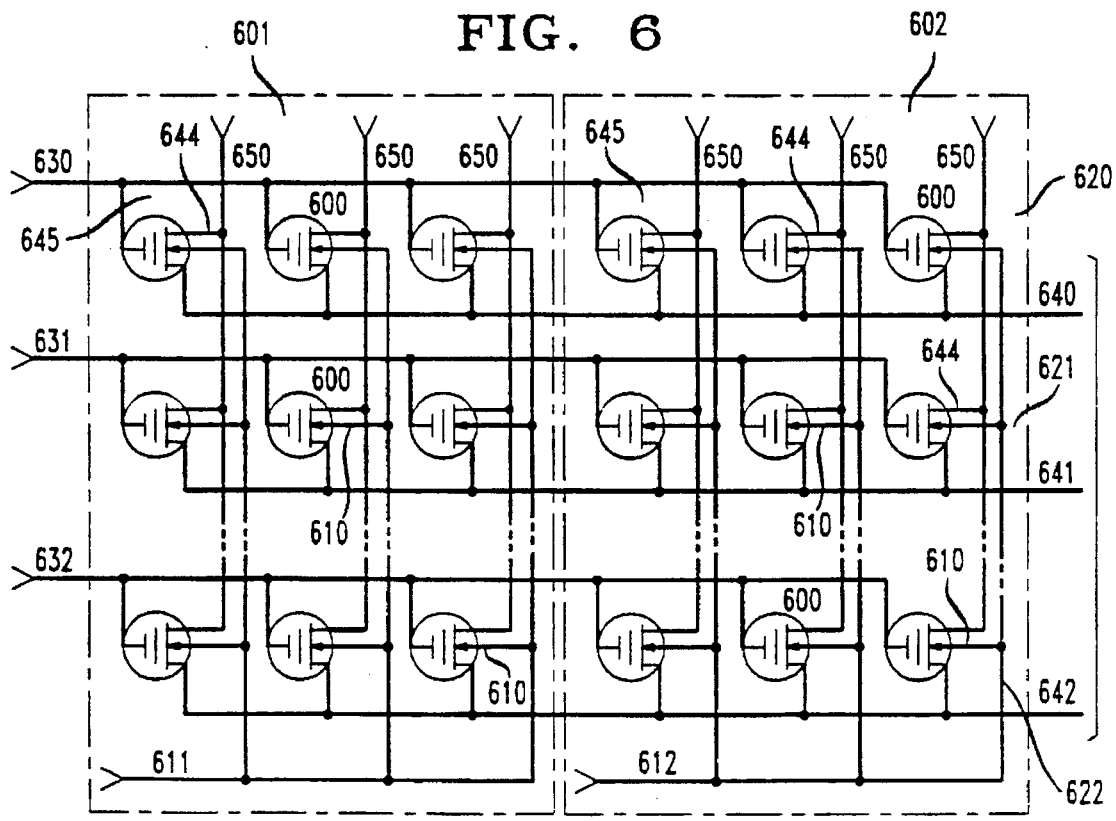
FIG. 6 is a schematic of an array of EPROM cells of the present invention.

To operate the array in FIG. 6 in a conventional write mode with the source nodes at a reference voltage of 0 V, one of the word lines (the word lines supply voltage to the control gates of the cells in the array) has a control gate to substrate potential $V_{CB}$ set to a very high value of about 12 to about 20 V. The bit lines to the cells that were desired to be programmed (i.e., the floating gate was desired to be charged) would be at a voltage of about 6 V to about 18 V. In this arrangement if a voltage was applied to two or more bit lines, then all of the cells at the intersection of the selected bit lines and the selected word line would be programmed. There is no way to deselect a cell in such an arrangement. Since the devices of the present invention only program when the substrate voltage is $-0.5$ V or more negative, a cell in a particular block can be deselected by raising the substrate voltage to the block (i.e., make it more positive) in which the cell to be deselected is found.

Although the device and process of the present invention have been described in the context of "writing" a cell by introducing negative charge onto the floating gate, one skilled in the an will appreciate that, by merely reversing the logic such that an uncharged or less-negatively charged floating gate is associated with a logic 1, introducing negative charge onto the floating gate "erases" the floating gate.

Referring again to FIG. 6, if the block 601 is to be erased but block 602 is not, then the voltage of the block select line to block 601 is within the range of −0.5 V to about −3 V and the voltage of the block select line 602 is greater than −0.5 V. Under these conditions only the cell in block 601 would be erased when a high voltage level is applied to the word line to which the cells are connected.

In the process of the present invention, a $V_{BS}$ is applied to the substrate when the EEPROM is writing. It is advantageous if the $V_{BS}$ is about −0.5 V to about −3 V and the $V_{DS}$ is about 1.1 V to about 3.3 V. This increases the efficiency of CISEI in the manner described above. The efficiency of electron injection into an EEPROM floating gate is measured using a variety of techniques. In one technique, the control gate is electrically connected (i.e., shorted) to the floating gate. This fixes the floating gate potential at the control gate potential. The current that would otherwise charge the floating gate is drained into the control gate electrode. Then, the control gate current so measured is a direct measure of the electron injection into the floating gate. An extension of this method allows information about stacked gate EEPROMS to be obtained using EEPROMS to be obtained using conventional similar to stacked gate EEPROMS with shorted floating gates. The following illustrations involve measurements and simulations of the gate current of several MOSFET structures which demonstrate some aspects of CISEI enumerated above.

Figure 7:
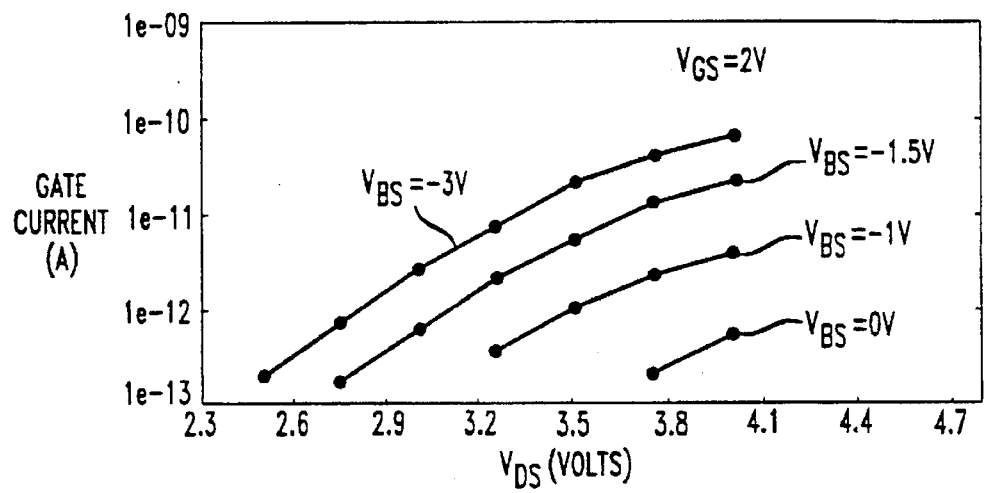
FIG. 7 is a graph of gate current vs. $V_{DS}$ at various substrate biases ($V_B$) for a MOSFET with a channel length of 0.5 µm.

For example, the measured gate current $I_G$ of a MOSFET (a device as depicted in FIG. 2 without regions 160 and 170 wherein floating gate 140 functions as the gate electrode) with a 0.5 μm channel length and a 0.05 μm drain/source junction depth is depicted in FIG. 7 as a function of substrate bias ($V_{BS}$) and drain source bias ($V_{DS}$) at a gate-source bias of 4 V. The devices have gate oxides with a thickness of about 50 Å. These devices illustrate that, as $V_{BS}$ decreases from 0 to −3 V, $I_G$ increases exponentially.

Figure 8:
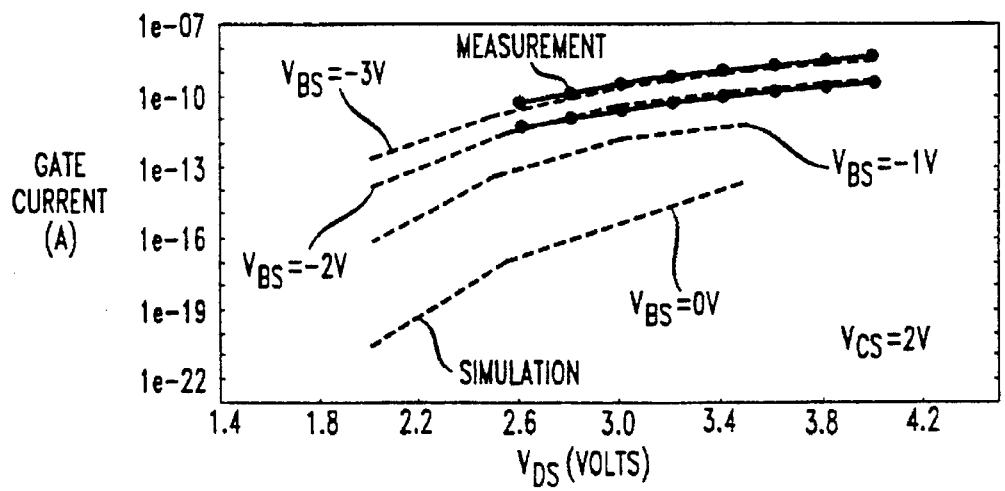
FIG. 8 is a graph of gate current vs. $V_{DS}$ at various $V_B$ for a MOSFET with a channel length of 0.4 μm and a gate oxide thickness of about 60 Å.

In FIG. 8, $I_G$ as a function of $V_{BS}$ is illustrated as a function of $V_{DS}$ for a MOSFET device with a channel length of 0.4 μm, a drain/source junction depth of about 0.07 μm, and a gate oxide thickness of about 60 Å. For efficient writing (e.g. wherein less than 1 ms is required to introduce the desired amount of negative charge on the floating gate), about $10^{-12}$ A to about $10^{-10}$ Å of gate current is needed. As illustrated in FIG. 8, at a $V_{GS}$ of 2 V, gate currents within the desired range are not obtained for $V_{BS}=0$ and $V_{DS}$ less than 3.5 V. However, when the $V_{BS}$ is decreased to about −1 V to about −3 V, then the requisite $I_G$ is obtained for $V_{DS}$ of about 2.2 V to about 3 V. As $V_{BS}$ increases, the amount of $V_{DS}$ needed to obtain the desired $I_G$ decreases.

Figure 9:
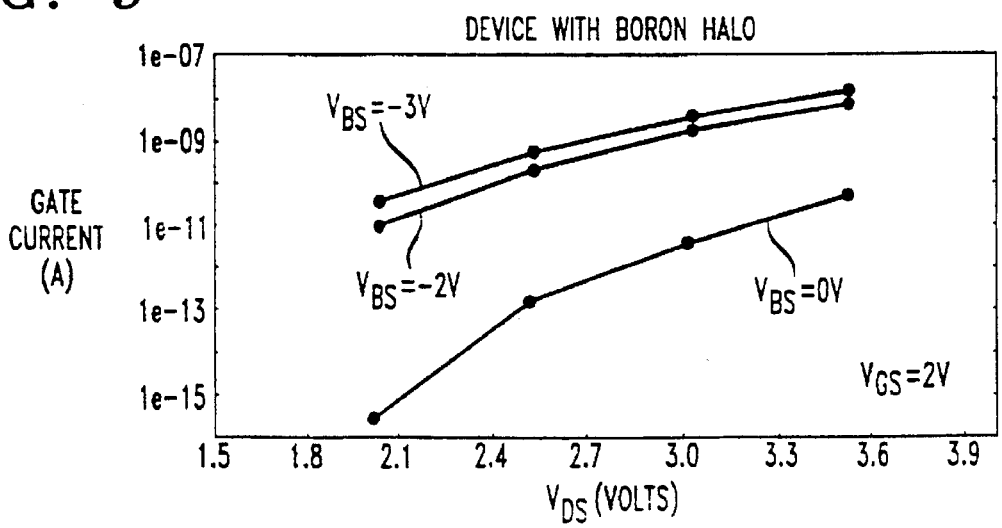
FIG. 9 is a graph of gate current vs. $V_{DS}$ at various $V_B$ for a MOSFET device with a doped boron halo at the drain-substrate junction.

FIG. 9 is a graph of the relationship between $V_{DS}$ and $I_G$ for a MOSFET device with a boron halo which is the result of doping the substrate at the drain substrate junction. The device has a channel length of 0.4 μm and a drain/source junction depth of about 0.07 μm. The boron concentration is about $10^{18}/cm^3$ at the drain-substrate junction to achieve the desired effect. FIG. 9 illustrates that, at a $V_{GS}$ of 2 V, the devices with a substrate bias provide acceptable gate current as described above at much lower $V_{DS}$ than does the device without a substrate bias. It follows that devices with the boron halo have acceptable gate current at lower $V_{DS}$ than devices without the boron halo when biased at the source voltages.

The invention claimed is:

1. A semiconductor n-channel device formed on a substrate comprising:

a source region and a drain region in the substrate;

a dielectric layer deposited on the substrate, a floating gate electrode formed on the dielectric layer wherein at least a portion of the floating gate electrode is overlying the drain region, an additional electric material formed on the surface of the floating gate electrode, and a control gate electrode formed on the additional dielectric material;

a means for negatively charging the floating gate including a means for applying a negative substrate-source bias voltage ($V_B-V_S$) of about −0.5 volts or more negative, a means for applying a control gate-source bias ($V_C-V_S$) of about 10 volts or less and a means for applying a drain-source bias voltage ($V_D-V_S$) of less than about 5 volts to the device wherein the current that charges the floating gate is initiated by the electron current from the source to the drain.

2. The semiconductor device of claim 1 wherein the bias between the substrate and the source is about −0.5 volts to about −3 volts when charging the floating gate.

3. The semiconductor device of claim 1 wherein the bias between the control gate and the source is less than the drain-source bias voltage.

4. The semiconductor device of claim 1, wherein the source voltage is about 0 volts, the drain voltage is about 1.1 to about 3.3 volts, and the substrate voltage is about −0.5 to about −3 volts when charging the floating gate.

5. The semiconductor device of claim 1 wherein the control gate voltage is less than or equal to the drain voltage.

6. The semiconductor device of claim 1 wherein the device is a stacked gate n-channel device.

7. The device of claim 1 wherein the voltage applied to the drain terminal effects a positive bias of about 1.1 volts to about 3.3 volts between the drain and the source.

8. The semiconductor device of claim 1 wherein the substrate comprises a region of silicon-germanium.

9. The semiconductor device of claim 8 wherein the drain is formed in the silicon-germanium region and the source is not formed in the silicon-germanium region.

10. The semiconductor device of claim 8 wherein the source and drain are formed in the silicon-germanium region.

11. A semiconductor n-channel device comprising:

a source region and a drain region in a semiconductor substrate;

a dielectric layer deposited on the substrate;

a floating gate electrode formed on the dielectric layer wherein a portion of the floating gate electrode overlies the drain region;

an additional dielectric material formed on the surface of the floating gate electrode, a control gate electrode formed on the additional dielectric material; and a connection for applying a drain-source bias of less than about 5 volts to the device and a connection for applying a control gate-source bias of less than about 10 volts wherein the device has a drain junction depth of about 0.05 μm or less, an n-type dopant concentration in the drain of at least about $5 \times 10^{19}/cm^3$, a p-type dopant concentration of at least about $2 \times 10^{18}/cm^3$ at the drain substrate junction, wherein the thickness of the dielectric layer between the floating gate and the substrate is about 10 nm or less, and wherein the current that charges the floating gate is initiated by the electron current from the source to the drain.

12. The device of claim 11 wherein the drain source bias applied through the connection is about 1.1 volts to about 3.3 volts.

13. A method for charging an n-channel floating gate of a memory cell having a source, drain, control gate, floating gate, and a substrate comprising:

applying a voltage to the drain terminal of the cell to effect a positive bias of less than about 5 volts between the drain and the source;

applying a voltage to the control gate terminal of the cell to effect a positive bias of about 10 volts or less between the control gate and the source; and;

applying a negative voltage to the substrate to effect a negative bias of at least about −0.5 volts between the substrate and the source wherein the current that charges the floating gate is initiated by the electron current from the source to the drain.

14. The method of claim 13 wherein the negative bias between the substrate and the source is about −0.5 volts to about −3 volts.

15. The method of claim 13 wherein the voltage applied to the drain terminal of the cell effects a positive bias of about 1.1 volts to about 3.3.

16. The method of claim, 13 wherein the voltage applied to the source is zero, the voltage applied to the substrate is about −0.5 to about −3 volts, the voltage applied to the control gate is less than about 10 volts and the voltage applied to the drain is about 1.1 volts to about 3.3 volts.

17. The method of claim 16 wherein the voltage applied to the control gate is less than or equal to the voltage applied to the drain.

18. An array of floating gate memory cells comprising:

at least two cells each cell having a source region and a drain region formed in a substrate, a dielectric layer deposited on the substrate, a floating gate electrode formed on the dielectric layer, an additional dielectric material formed on the surface of the floating gate electrode, and a control gate electrode formed on the additional dielectric material wherein the voltage supplied to the control gate provides a control gate-source bias of less than about 10 volts, and a connection for applying a negative substrate-source bias voltage of at least about −0.5 volts to the substrate, wherein the current that charges the floating gate is initiated by the electron current from the source to the drain, and wherein the substrate of at least one cell is electrically connected to a first select and wherein the substrate of at least one cell is connected to a second select, wherein the first and second selects are electrically isolated from each other.

19. The array of claim 18 wherein the bias between the drain and the source of each cell in the array is less than about 5 volts, and the substrate source bias voltage applied to the substrate in each cell in the array is about −0.5 volts, to about −3 volts when charging the floating gate.

20. The array of claim 19 wherein the source voltage applied to each cell in the array is about 0 volts, the bias between the drain and the source of each cell in the array is about 1.1 volts to about 3.3 volts, the drain voltage applied to each cell in the array is about 1.1 volts to about 3.3 volts, and the substrate voltage is about −0.5 volts to about −3 volts when charging the floating gate.

21. The array of claim 20 wherein the voltage supplied to the control gate is about 1.1 volts to about 3.3 volts.

22. The array of claim 19 wherein the voltage supplied to the control gate is less than or equal to the voltage applied to the drain.

* * * * *